(12) United States Patent
Hsu et al.

(10) Patent No.: US 11,211,350 B2
(45) Date of Patent: Dec. 28, 2021

(54) SEMICONDUCTOR PACKAGE AND MANUFACTURING METHOD THEREOF

(71) Applicant: Powertech Technology Inc., Hsinchu County (TW)

(72) Inventors: Hung-Hsin Hsu, Hsinchu County (TW); Shang-Yu Chang Chien, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/521,596

(22) Filed: Jul. 25, 2019

(65) Prior Publication Data
US 2020/0273829 A1 Aug. 27, 2020

Related U.S. Application Data

(60) Provisional application No. 62/808,808, filed on Feb. 21, 2019.

(51) Int. Cl.
*H01L 21/56* (2006.01)
*H01L 23/00* (2006.01)
*H01L 23/29* (2006.01)
*H01L 23/31* (2006.01)
(Continued)

(52) U.S. Cl.
CPC .............. *H01L 24/09* (2013.01); *H01L 21/56* (2013.01); *H01L 21/565* (2013.01);
(Continued)

(58) Field of Classification Search
CPC . H01L 24/09; H01L 21/76877; H01L 21/565; H01L 23/293; H01L 21/76816;
(Continued)

(56) References Cited

U.S. PATENT DOCUMENTS 9,431,342 B2 8/2016 Yu et al.
2017/0345761 A1* 11/2017 Yu ..................... H01L 21/4857
(Continued)

FOREIGN PATENT DOCUMENTS

CN 101197360 6/2008
CN 106560917 4/2017
(Continued)

OTHER PUBLICATIONS

"Office Action of Taiwan Counterpart Application", dated Jul. 14, 2020, p. 1-p. 12.
(Continued)

*Primary Examiner* — Thanh T Nguyen
(74) *Attorney, Agent, or Firm* — JCIPRNET

(57) ABSTRACT

A semiconductor package and a manufacturing method thereof are provided. The semiconductor package includes first dies, an insulating encapsulation laterally encapsulating the first dies, a second die disposed over the portion of the insulating encapsulation and at least partially overlapping the first dies, and a redistribution structure disposed on the insulating encapsulation and electrically connected to the first dies and the second die. A second active surface of the second die faces toward first active surfaces of the first dies. The redistribution structure includes a first conductive via disposed proximal to the first dies, and a second conductive via disposed proximal to the second die. The first and second conductive vias are electrically coupled and disposed in a region of the redistribution structure between the second die and one of the first dies. The first conductive via is staggered from the second conductive via by a lateral offset.

18 Claims, 14 Drawing Sheets

SP1

(51) Int. Cl.
  *H01L 21/768* (2006.01)
  *H01L 23/522* (2006.01)
  *H01L 23/538* (2006.01)
  *H01L 25/065* (2006.01)

(52) U.S. Cl.
  CPC .. *H01L 21/76816* (2013.01); *H01L 21/76877* (2013.01); *H01L 23/293* (2013.01); *H01L 23/3107* (2013.01); *H01L 23/5226* (2013.01); *H01L 23/5384* (2013.01); *H01L 23/5385* (2013.01); *H01L 23/5386* (2013.01); *H01L 23/5389* (2013.01); *H01L 25/0655* (2013.01); *H01L 2224/02372* (2013.01); *H01L 2224/04105* (2013.01)

(58) Field of Classification Search
  CPC .............. H01L 23/3107; H01L 23/5226; H01L 2224/02372
  See application file for complete search history.

(56) References Cited

U.S. PATENT DOCUMENTS

| | | | |
|---|---|---|---|
| 2018/0012863 A1* | 1/2018 | Yu | H01L 21/78 |
| 2019/0013276 A1 | 1/2019 | Lee et al. | |
| 2019/0067249 A1* | 2/2019 | Huang | H01L 21/6835 |
| 2019/0131277 A1* | 5/2019 | Yang | H01L 23/3135 |
| 2019/0244943 A1* | 8/2019 | Fan | H01L 25/18 |
| 2020/0321313 A1* | 10/2020 | Hsu | H01L 23/3128 |

FOREIGN PATENT DOCUMENTS

| | | |
|---|---|---|
| CN | 106684048 | 5/2017 |
| CN | 107452721 | 12/2017 |
| CN | 107579049 | 1/2018 |
| CN | 107808878 | 3/2018 |
| CN | 108447860 | 8/2018 |
| TW | I575656 | 3/2017 |
| TW | 201801201 | 1/2018 |
| TW | 201826461 | 7/2018 |
| TW | 201832328 | 9/2018 |
| TW | 201907534 | 2/2019 |

OTHER PUBLICATIONS

"Office Action of China Counterpart Application", dated Jul. 29, 2021, p. 1-p. 11.

* cited by examiner

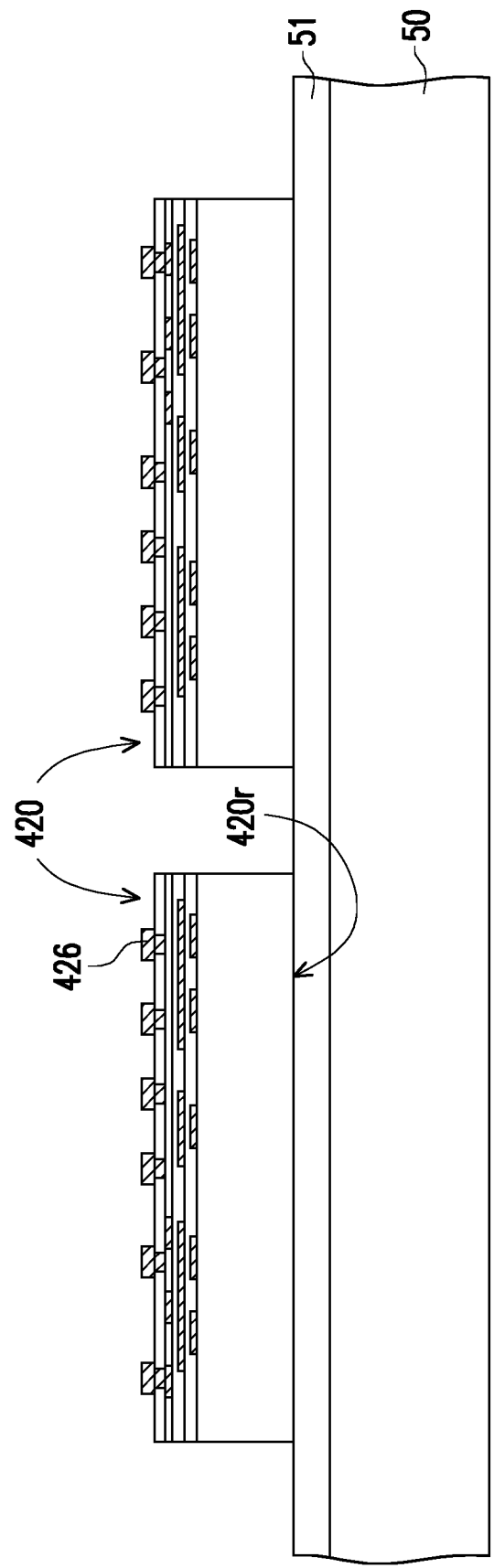

SEMICONDUCTOR PACKAGE AND MANUFACTURING METHOD THEREOF

CROSS-REFERENCE TO RELATED APPLICATION

This application claims the priority benefit of U.S. provisional application Ser. No. 62/808,808, filed on Feb. 21, 2019. The entirety of the above-mentioned patent application is hereby incorporated by reference herein and made a part of this specification.

BACKGROUND OF THE INVENTION

Field of Invention

The present invention generally relates to a package structure and a manufacturing method thereof, and more particularly, to a semiconductor package including a bumpless die and a manufacturing method thereof.

Description of Related Art

In recently years, electronic apparatus are more important for human's life. In order for electronic apparatus design to achieve being light, slim, short, and small, semiconductor packaging technology has kept progressing, in attempt to develop products that are smaller in volume, lighter in weight, higher in integration, and more competitive in market. Since the semiconductor package technique is highly influenced by the development of integrated circuits, therefore, as the size of electronics has become demanding, so does the package technique. In addition, the dimension of the conductive features of redistribution layer (RDL) in a semiconductor package diminishes but makes the conductive features more sensitive to cracks when subjecting to forces (e.g., bonding, soldering, reflowing, etc.). As such, how to provide a semiconductor package that is more protected against such cracks while maintaining the process simplicity and miniaturization has become a challenge to researchers in the field.

SUMMARY OF THE INVENTION

The disclosure provides a semiconductor package and a manufacturing method thereof, which provides improvement in electrical performance and greater manufacturability.

The disclosure provides a semiconductor package. The semiconductor package includes a plurality of first dies disposed side by side, an insulating encapsulation laterally encapsulating the first dies, a second die disposed over the portion of the insulating encapsulation and at least partially overlapping the first dies, and a redistribution structure disposed on the insulating encapsulation and electrically connected to the first dies and the second die. A portion of the insulating encapsulation separates the first dies from one another. A second active surface of the second die faces toward first active surfaces of the first dies. The redistribution structure includes a first conductive via disposed at a first level of the redistribution structure proximal to the first dies, and a second conductive via disposed at a second level of the redistribution structure proximal to the second die. The second level is stacked on the first level. The first conductive via and the second conductive via are electrically coupled and disposed in a region of the redistribution structure interposed between the second active surface of the second die and the first active surface of one of the first dies, wherein the first conductive via is staggered from the second conductive via by a lateral offset.

The disclosure provides a manufacturing method of a semiconductor package. The manufacturing method includes at least the following steps. A plurality of first dies is disposed on a first surface of a redistribution circuitry. The redistribution circuitry includes a first conductive via formed at a first level of the redistribution circuitry proximal to the first dies, and a second conductive via formed at a second level of the redistribution circuitry stacked on the first level, and a center of the first conductive via is laterally offset from a center of the second conductive via. An insulating encapsulation is formed on the redistribution circuitry to encapsulate the first dies. A second die is disposed on a second surface of the redistribution circuitry opposite to the first surface, wherein the second die covers the portion of the insulating encapsulation and is electrically coupled to the first dies through the redistribution circuitry.

The disclosure provides a manufacturing method of a semiconductor package. The manufacturing method includes at least the following steps. A plurality of first dies is encapsulated with an insulating encapsulation, wherein a portion of the insulating encapsulation is formed between two of the adjacent first dies. A redistribution circuitry is formed on the first dies. The redistribution circuitry includes a first conductive via formed at a first level of the redistribution circuitry and connected to a contact feature of one of the first dies exposed by the insulating encapsulation, a second conductive via disposed at a second level of the redistribution circuitry stacked on the first level, and a center of the first conductive via is staggered from a center of the second conductive via by an offset. A second die is disposed on the second level of the redistribution circuitry to be electrically coupled to the first dies through the redistribution circuitry.

Based on the above, since the semiconductor package includes the first dies and the second die disposed in a face-to-face configuration for shortening interconnection distance therebetween, and the lower power consumption and high bandwidth of the semiconductor package may be achieved. The first and second conductive vias of the redistribution structure are disposed in a shifted-via configuration, such that the semiconductor package including such shifted-via configuration may offer good reliability and generate less stress during processing and operation, thereby eliminating cracks and other defects issue.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 5A to FIG. 5E are schematic cross-sectional views illustrating a manufacturing method of a semiconductor package according to an embodiment of the disclosure.

DESCRIPTION OF EMBODIMENTS

Figure 1A:
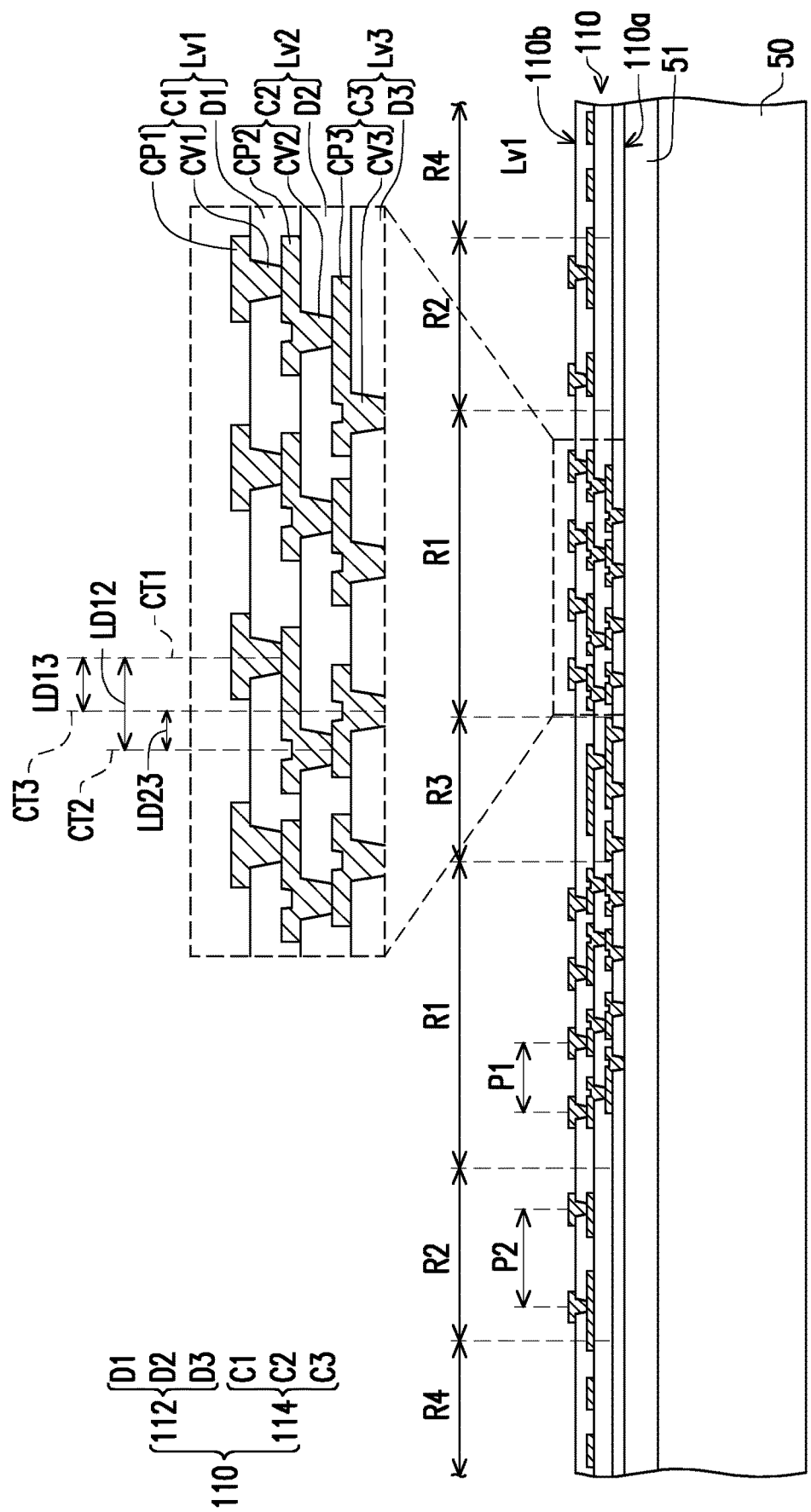
FIG. 1A to FIG. 1F are schematic cross-sectional views illustrating a manufacturing method of a semiconductor package according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1A to FIG. 1F are schematic cross-sectional views illustrating a manufacturing method of a semiconductor package according to an embodiment of the disclosure. Referring to FIG. 1A, a redistribution structure 110 is formed over a temporary carrier 50. For example, the temporary carrier 50 may be a wafer-level or panel-level substrate made of glass, plastic, metal, or other suitable materials as long as the material is able to withstand the subsequent processes while carrying the structure formed thereon. The redistribution structure 110 may include a first surface 110a facing towards the temporary carrier 50, and a second surface 110b opposite to the first surface 110a. In some embodiments, a de-bonding layer 51 may be disposed between the first surface 110a of the redistribution structure 110 and the temporary carrier 50 to enhance the releasibility of the redistribution structure 110 from the temporary carrier 50 in the subsequent processes. For example, the de-bonding layer 51 includes a light to heat conversion (LTHC) release layer or other suitable release layers. In other embodiments, the de-bonding layer 51 is omitted, and the first surface 110a of the redistribution structure 110 may be in direct contact with the temporary carrier 50.

In some embodiments, the redistribution structure 110 includes a plurality of patterned dielectric layers 112 and a plurality of patterned conductive layers 114 alternately stacked upon one another. Each level of the patterned conductive layers 114 may include conductive lines, conductive pads, conductive vias, etc. The conductive lines and the conductive pads at one level of the patterned conductive layers 114 may be formed on the top surface of the underlying patterned dielectric layer 112. The conductive vias connected to the conductive pads and may penetrate through the patterned dielectric layer 112 such that the conductive vias are laterally covered by the patterned dielectric layer 112. In some embodiments, the patterned dielectric layer 112 is formed prior to the patterned conductive layer 114. In other embodiments, the patterned conductive layer 114 is formed prior to the patterned dielectric layer 112.

In an exemplary embodiment, the formation of the redistribution structure 110 includes at least the following steps.

A dielectric material (e.g., polyimide (PI), polybenzoxazole (PBO), benezocyclobutene (BCB), etc.) may be formed over the temporary carrier 50 using any suitable deposition process such as spin-coating, lamination, or the like. Next, a portion of the dielectric material is removed to form the patterned dielectric layer 112 with openings (i.e. the bottommost dielectric layer D3) at the bottom level Lv3 by using such as lithography (i.e., exposure and development processes) and an etching process, or other suitable removing process.

Next, a seed layer (not illustrated) is conformally formed on the bottommost dielectric layer D3 and inside the openings of the bottommost dielectric layer D3, and then a patterned photoresist layer (not illustrated) having openings may be formed on the seed layer. Next, a conductive material layer (e.g., copper, aluminium, nickel, gold, metal alloy, etc.; not illustrated) may be formed on the seed layer and inside the openings of the patterned photoresist layer by using plating, sputtering, or other suitable process. Subsequently, the patterned photoresist layer may be removed, and then the seed layer unmasked by the conductive material layer may be removed to form the patterned conductive layer 114 at the bottommost level Lv3 (i.e. the bottommost conductive layer C3). For example, the bottommost conductive layer C3 includes the conductive vias CV3 formed inside the openings of the bottommost dielectric layer D3, the conductive pads CP3 connected to the conductive vias CV3 and formed on the top surface of the bottommost dielectric layer D3, and the conductive lines (not labeled) connected to the conductive pads CP3 and extending to distribute on the top surface of the bottommost dielectric layer D3.

The abovementioned steps may be performed multiple times to obtain a multi-layered redistribution structure 110 as required by the circuit design. For example, the intermediate level of the patterned dielectric layers 112 with openings (i.e. the intermediate dielectric layer D2) is formed on the bottommost dielectric layer D3 to partially cover the bottommost conductive layer C3. For example, at least a portion of the conductive pads CP3 is exposed by the openings of the intermediate dielectric layer D2 for the subsequently formed conductive vias to land on. Next, the patterned conductive layer 114 at the intermediate level Lv2 (i.e. the intermediate conductive layer C2) is formed on and penetrates through the intermediate dielectric layer D2. For example, the conductive lines (not illustrated) and the conductive pads CP2 of the intermediate conductive layer C2 are formed on the top surface of the intermediate dielectric layer D2, and the conductive vias CV2 of the intermediate conductive layer C2 vertically extend between the conductive pads CP2 and CP3. In some embodiments, each of the conductive vias CV2 of the intermediate conductive layer C2 lands on one of the conductive pads CP3.

Next, the topmost level of the patterned dielectric layers 112 with openings (i.e. the topmost dielectric layer D1) is formed on the intermediate dielectric layer D2 to partially cover the intermediate conductive layer C2. For example, the openings of the topmost dielectric layer D1 expose at least a portion of the conductive pads CP2. Next, the patterned conductive layer 114 at the topmost level Lv1 (i.e. the topmost conductive layer C1) is formed on and penetrates through the topmost dielectric layer D1. For example, the conductive pads CP1 and/or the conductive lines (not illustrated) of the topmost conductive layer C1 are formed on the top surface of the top dielectric layer D1 for further electrical connection, and the conductive vias CV1 of the topmost conductive layer C1 extend between the conductive pads CP1 and CP2. It should be noted that a three-layered redistribution structure shown in FIG. 1A is for illustrative purpose, and the number of levels of the redistribution structure 110 construes no limitation in the disclosure.

Continue to FIG. 1A, the conductive via CV1 lands on the conductive pad CP2 which is connected to the conductive via CV2, and the conductive via CV2 lands on the conductive pad CP3 which is connected to the conductive via CV3. In some embodiments, the conductive vias CV1, CV2, and CV3 are laterally offset from one another. For example, centers (e.g., CT1, CT2, CT3) of the conductive vias (e.g., CV1, CV2, CV3) at different levels (e.g., Lv1, Lv2, Lv3) are misaligned. For the sake of reference, this arrangement of conductive vias is referred to as a shifted-via configuration herein. In some embodiments, the conductive vias CV1, CV2, and CV3 are tapered in a direction from the second surface 110b to the first surface 110a. Alternatively, the conductive vias CV1, CV2, and CV3 include substantially vertical sidewalls.

In some embodiments, a lateral distance LD12 formed between the center CT1 of the conductive via CV1 and the center CT2 of the conductive via CV2 is greater than zero. The lateral distance LD23 formed between the center CT2 of the conductive via CV2 and the center CT3 of the conductive via CV3 may be greater than zero. The lateral distance LD13 formed between the center CT1 of the conductive via CV1 and the center CT3 of the conductive via CV3 may be substantially equal to zero or greater than zero. In some embodiments, the lateral distance LD13 is greater than the lateral distance LD12 and/or LD23. Alternatively, the lateral distance LD13 is substantially equal to or less than the lateral distance LD12 and/or LD23. The variations will be described later in other embodiments in accompanying with figures.

Still referring to FIG. 1A, the redistribution structure 110 includes a first region R1, a second region R2 aside the first region R1, a third region R3 aside the first region R1 and opposite to the second region R2, and a fourth region R4 aside the second region R2 and opposite to the first region R1. In some embodiments, the third region R3 is encircled by the first region R1, the first region R1 is encircled by the second region R2, and the second region R2 is encircled by the fourth region R4. The conductive pads CP1 of the topmost conductive layer C1 may be formed in the first region R1 and the second region R2, whereas the conductive pads CP1 may be or may not be formed in the third region R3 and the fourth region R4. In some embodiments, the third region R3 (or the fourth region R4) is free of the conductive pads CP1 and/or the conductive vias CV1 of the topmost conductive layer C1. In some embodiments, the conductive pads CP1 at the topmost level Lv1 are referred to as bond pads.

In some embodiments, the distribution density of the conductive pads CP1 formed in the first region R1 is denser than that of the conductive pads CP1 formed in the second region R2. For example, a first pitch P1 between the centers CT1 of two adjacent conductive pads CP1 formed in the first region R1 is less than a second pitch P2 between the centers CT1 of two adjacent conductive pads CP1 formed in the second region R2. For example, the first pitch P1 in the first region R1 ranges about 20 μm to 70 μm. The second pitch P2 in the second region R2 may be greater than about 70 μm. For example, the second pitch P2 is in a range of about 100 μm to about 300 μm. In some embodiments, the second pitch P2 and the first pitch P1 may define a ratio (P2/P1) greater than or substantially equal to 1. Alternatively, the first pitch P1 may be substantially equal to or greater than the second pitch P2.

Figure 1B:
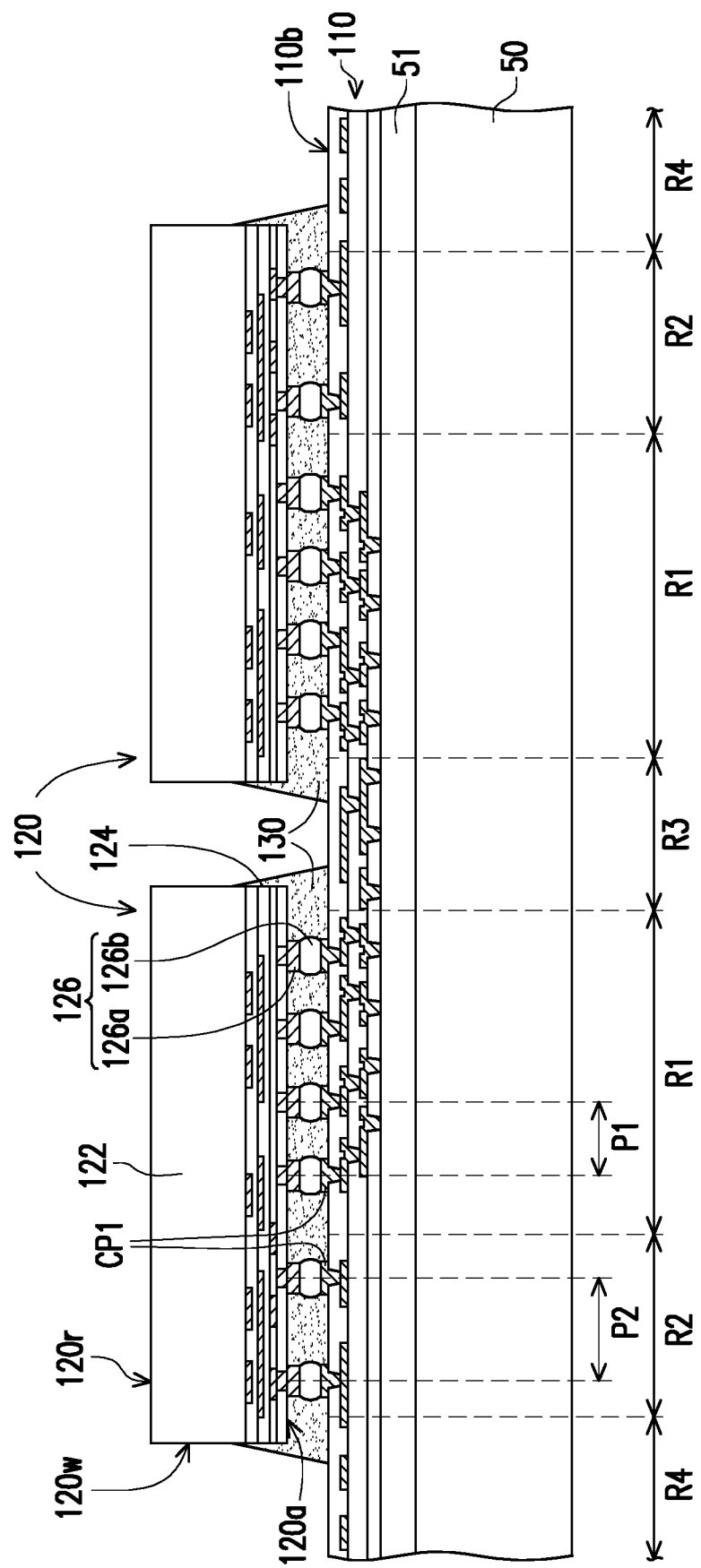

Referring to FIG. 1B, a plurality of first dies 120 is disposed on and electrically coupled to the redistribution structure 110. The first dies 120 may be disposed on the redistribution structure 110 side by side and spatially apart from one another. For example, each first die 120 includes an active surface 120a facing towards the second surface 110b of the redistribution structure 110, a rear surface 120r opposite to the active surface 120a, and sidewalls 120w connected to the active surface 120a and the rear surface 120r. In some embodiments, the first die 120 includes a semiconductor substrate 122 having integrated circuit devices (not shown; such as active components (e.g., transistors), passive components (e.g., resistors, capacitors), etc.) formed therein, an interconnect structure 124 disposed on the semiconductor substrate 122 and electrically coupled to the integrated circuit devices, and a plurality of contact features 126 disposed on the interconnect structure 124 and distributed at the active surface 120a. The contact features 126 may be electrically coupled to the integrated circuit devices of the semiconductor substrate 122 through the interconnect structure 124 and may be mounted on the redistribution structure 110.

In some embodiments, each of the contact features 126 includes a pillar 126a and a cap 126b disposed on the pillar 126a. A material of the pillar 126a may be or may include copper, gold, metal alloy, etc., and a material of the cap 126b may be made of solder or other suitable conductive materials. In some embodiments, the contact features 126 are distributed at the active surface 120a with different pitches. For example, the first pitches P1 of one of the first die 120 substantially match the first pitches P1 of the conductive pads CP1 in the first region R1, and the second pitches P2 of the one of the first die 120 substantially match the second pitches P2 of the conductive pads CP1 in the second region R2. For example, the contact features 126 having larger pitches may serve as the power and/or ground pins, and the contact features having finer pitches may serve as signal pins.

Continue to FIG. 1B, a flip-chip bonding process may be performed to mount the first dies 120 onto the second surface 110b of the redistribution structure 110. For example, after disposing the first dies 120 on the second surface 110b of the redistribution structure 110, the contact features 126 with the first pitches P1 are substantially aligned with the first pitches P1 of the redistribution structure 110 in the first region R1, and the contact features 126 with the second pitches P2 of the first dies 120 are substantially aligned with the second pitches P2 of the redistribution structure 110 in the second region R2. In some embodiments, the caps 126b of the contact features 126 including solder material may facilitate alignment of the contact features 126 and the conductive pads CP1. A soldering process and a reflowing process are optionally performed for enhancement of the adhesion between the contact features 126 of the first dies 120 and the conductive pads CP1 of the redistribution structure 110. In some embodiments, an underfill 130 is formed in the gap between the active surfaces 120a of the first dies 120 and the second surface 110b of the redistribution structure 110 to at least laterally cover the contact features 126 and the conductive pads CP1 for enhancing the reliability of the bonding. Alternatively, the underfill 130 is omitted. It should be noted that the flip-chip bonding is for illustrative purpose, and other suitable bonding process may be employed.

Figure 1C:
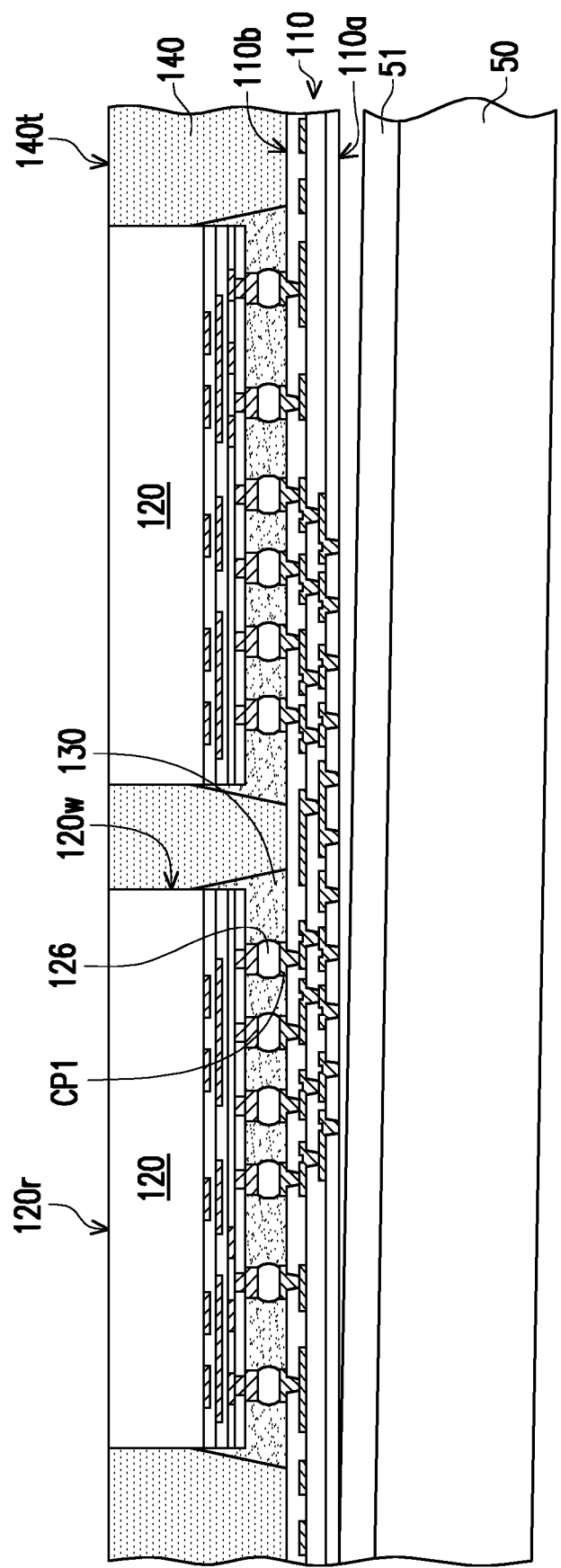

Referring to FIG. 1C, an insulating encapsulation 140 is formed on the redistribution structure 110 to encapsulate the first dies 120 and the underfill 130. The insulating encapsulation 140 may be formed by an insulating material such as epoxy or other suitable resins. In some embodiments, the insulating encapsulation 140 includes a molding compound, a molding underfill, or the like, and may be formed by a molding process. For example, an insulating material is formed on the second surface 110b of the redistribution structure 110 to form the insulating encapsulation 140 such that the first dies 120 are over-molded by the insulating encapsulation 140 and the gap between the sidewalls 120w of the adjacent first dies 120 are filled by the insulating encapsulation 140. The insulating encapsulation 140 is optionally thinned to expose the rear surfaces 120r of the first dies 120 so as to reduce the overall thickness of the structure by using, for example, grinding, chemical-mechanical polishing (CMP), etching, combinations thereof, etc. In such embodiments in which the thinning process is performed, the insulating encapsulation 140 covers the sidewalls 120w of the first dies 120, and the top surface 140t of the insulating encapsulation 140 is substantially leveled with the rear surfaces 120r of the first dies 120. In other embodiments in which the underfill 130 is omitted, the insulating encapsulation 140 covers the sidewalls 120w of the first dies 120 and extends into the gap between the first dies 120 and the second surface 110b of the redistribution structure 110 to laterally cover the contact features 126 of the first dies 120 and the conductive pads CP1 of the redistribution structure 110.

Continue to FIG. 1C, in some embodiments, after forming the insulating encapsulation 140, the temporary carrier 50 is removed so that the first surface 110a of the redistribution structure 110 is exposed for further processing. For example, the external energy (e.g., UV laser, visible light or heat) may be applied to the de-bonding layer 51 so that the redistribution structure 110 may be separated from the temporary carrier 50. Other suitable removal process may be employed to separate the temporary carrier 50 from the redistribution structure 110.

Figure 1D:
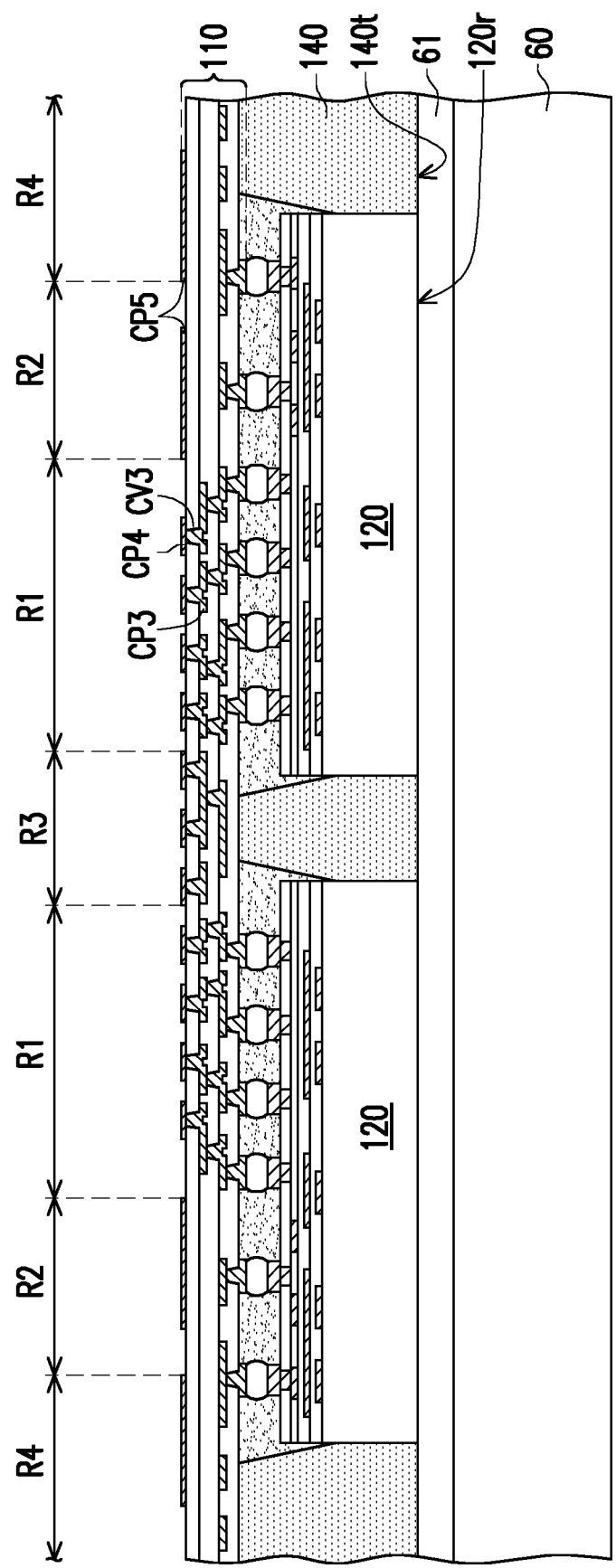

Referring to FIG. 1D, in some embodiments, for processing onto the first surface 110a of the redistribution structure 110, the structure shown in FIG. 1C may be flipped upside down and then disposed on a temporary carrier 60. In some embodiments, a de-bonding layer 61 may be disposed between the temporary carrier 60 and the top surface 140t of the insulating encapsulation 140 (along with the rear surfaces 120r of the first dies 120 in some embodiments) to enhance the releasibility therebetween. The materials of the temporary carrier 60 and the de-bonding layer 61 may be similar to those of the temporary carrier 50 and the de-bonding layer 51, and the details are omitted for brevity. Alternatively, the flipping and attaching processes may be omitted.

Continue to FIG. 1D, after disposing on the temporary carrier 60, a plurality of first conductive pads CP4 and a plurality of second conductive pads CP5 of the redistribution structure 110 are formed on the first surface 110a for further electrical connection by, for example, depositing and patterning conductive materials (e.g., copper, nickel, gold, and/or the like) on the bottommost dielectric layer D3 of the redistribution structure 110, etc. For example, the copper layer (not illustrated) is physically connected to the conductive vias CV3, the nickel layer (not illustrated) is formed on the copper layer and the gold layer (not illustrated) is formed on the nickel layer, such that the nickel layer may act as a barrier layer for preventing copper diffusion into the gold layer and preventing oxidation from occurring.

The first conductive pads CP4 may be formed in the central region of the redistribution structure 110 (e.g., the first region R1 and/or the third region R3) and may be physically and electrically connected to the conductive vias CV3 of the redistribution structure 110. The second conductive pads CP5 may be formed in the peripheral region of the redistribution structure 110 (e.g., the second region R2 and/or the fourth region R4) and may be physically and electrically connected to the redistribution structure 110. In some embodiments, the dimensions (e.g., widths or diameters) of the second conductive pads CP5 are greater than those of the first conductive pads CP4 for different mounting purposes. In some embodiments, the first conductive pads CP4 are referred to as the bond pads. In some embodiments, the second conductive pads CP5 are referred to as the under-ball metallurgy (UBM) pads for a ball mounting process.

Figure 1E:
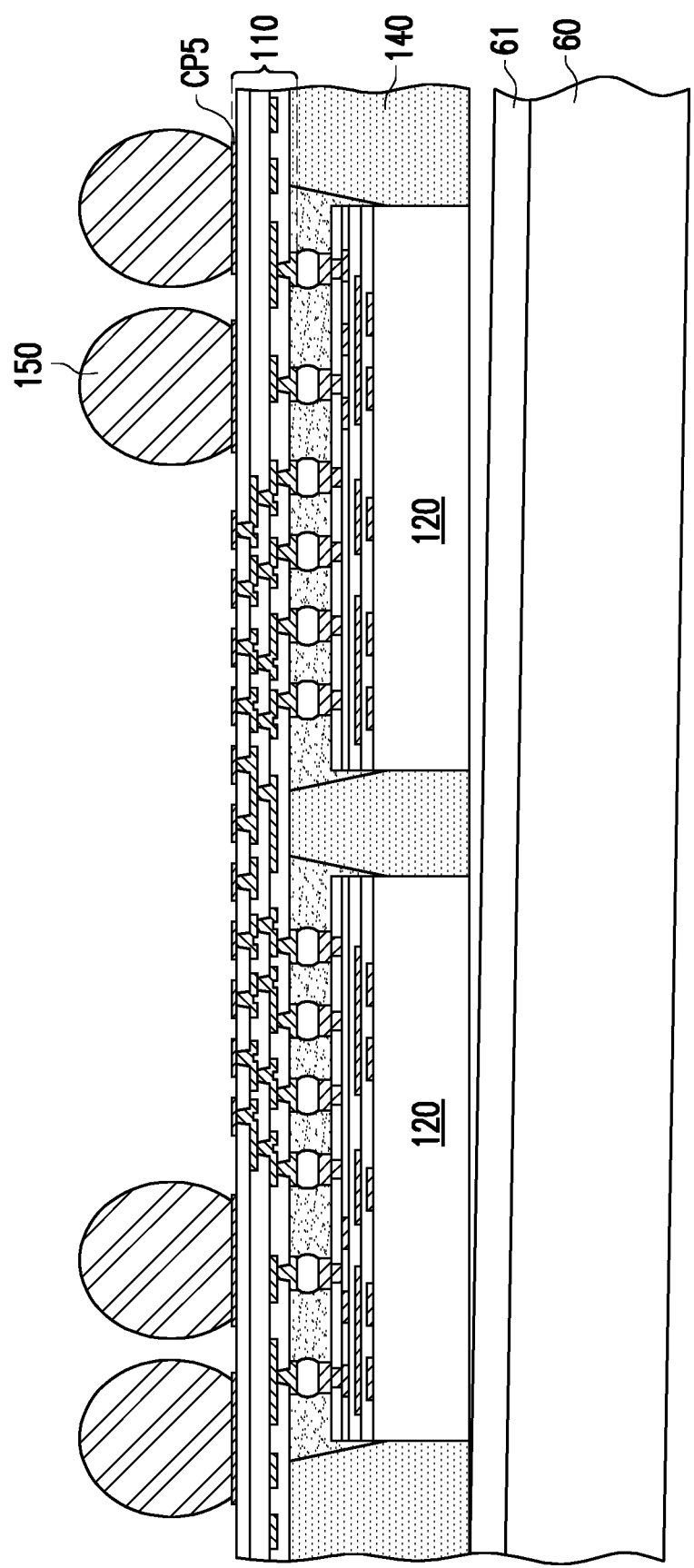

Referring to FIG. 1E, a plurality of conductive terminals 150 are formed on the second conductive pads CP5 of the redistribution structure 110 by, for example, a ball mounting process, a plating process or other suitable process. In some embodiments, the conductive terminals 150 are solder balls. Other possible forms and shapes of the conductive terminals 150 may be used according to the design requirement. A soldering process and a reflowing process are optionally performed for enhancement of the adhesion between the conductive terminals 150 and the second conductive pads CP5 of the redistribution structure 110. The conductive terminals 150 may be electrically coupled to the first dies 120 through the redistribution structure 110. In some embodiments, the temporary carrier 60 is removed by applying external energy to the de-bonding layer 61 before forming the conductive terminals 150. Other removal process of the temporary carrier 60 may be employed. Alternatively, the temporary carrier 60 is removed after forming the conductive terminals 150.

Figure 1F:
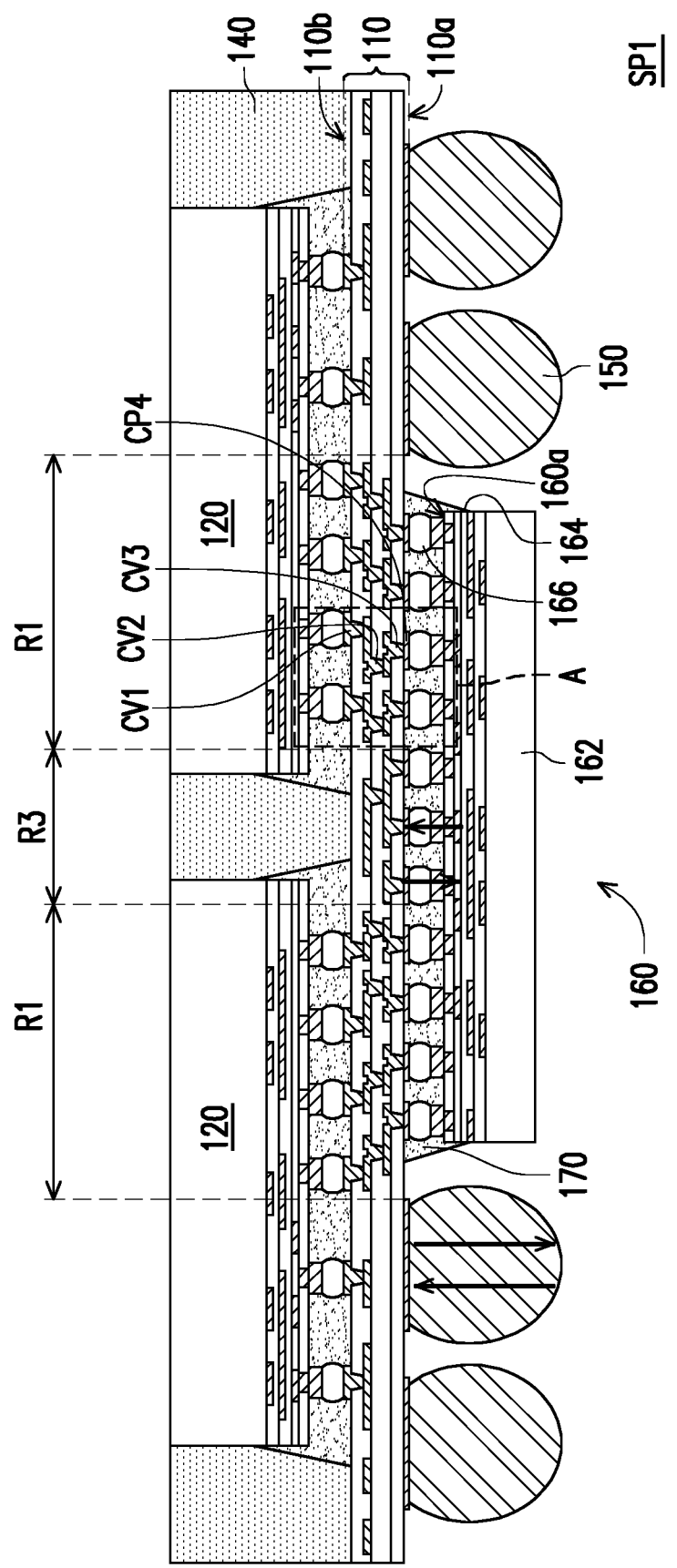

Referring to FIG. 1F, a second die 160 is disposed on the first surface 110a of the redistribution structure 110 by, for example, a flip-chip bonding process or other suitable bonding process. In some embodiments, the second die 160 includes a semiconductor substrate 162 having integrated circuit devices (not shown; such as active components (e.g., transistors), passive components (e.g., resistors, capacitors), etc.) formed therein, an interconnect structure 164 disposed on the semiconductor substrate 162 and electrically coupled to the integrated circuit devices, and a plurality of contact features 166 disposed on the interconnect structure 164 and distributed at the active surface 160a. The contact features 166 may be electrically coupled to the integrated circuit devices of the semiconductor substrate 162 through the interconnect structure 164. The second die 160 may be surrounded by the conductive terminals 150.

In some embodiments, the pitches of the contact features 166 substantially match the pitches of the first conductive pads CP4 formed in the third region R3 and the first region R1. The second die 160 and the first dies 120 are respectively bonded to the first conductive pads CP4 and the conductive pads CP1 formed at two opposite surfaces (e.g., first surface 110a and second surface 110b) of the redistribution structure 110. In some embodiments, an underfill 170 is formed in the gap between the active surface 160a of the second die 160 and the first surface 110a of the redistribution structure 110 to at least laterally cover the contact features 166 and the conductive pads CP4 for enhancing the reliability of the bonding.

In some embodiments, the first dies 120 and the second die 160 are active dies, and the second die 160 may perform a function different from the first dies 120. For example, the first dies 120 are memory dies (e.g., DRAM, SRAM, volatile or non-volatile storage die, or the like), and the second die 160 is a processor die (e.g., a system on a chip (SoC)). In some embodiments, the second die 160 is an application specific integrated circuit (ASIC) die. Other types or functions of dies may be employed, which are not limited thereto.

In some embodiments, the aforementioned processes are performed at wafer or panel level, and after bonding the second die 160 and forming the underfill 170, a singulation process may be performed to form a plurality of semiconductor packages SP1. For example, a dicing tool (not shown) may cut through the insulating encapsulation 140 and the redistribution structure 110 along scribe lines (not shown) to separate the structures from one another. Up to here, the manufacturing process of the semiconductor package SP1 is substantially completed.

As shown in FIG. 1F, the semiconductor package SP1 includes the first dies 120 disposed side by side, the insulating encapsulation 140 laterally encapsulating the first dies and separating the first dies 120 from one another, the second die 160 having the active surface 160a facing towards the active surfaces 120a of the first dies 120, the redistribution structure 110 interposed between and electrically connected to the first dies 120 and the second die 160, and the conductive terminals 150 surrounding the second die 160 and electrically coupled to the first dies 120 and the second die 160. In some embodiments, the electrical signal (as indicated by arrows) of the second die 160 is transmitted from or to the conductive terminals 150 through the circuitry of the redistribution structure 110 in the third region R3, where the third region R3 corresponds to the portion of the insulating encapsulation 140 between the adjacent first dies 120.

The second die 160 is disposed over the portion of the insulating encapsulation 140 between the adjacent first dies 120 in a face-to-face configuration, and the second die 160 at least partially overlaps the first dies 120. In some embodiments, both of the conductive via CV3 and the conductive via CV1 are formed in the first region R1 of the redistribution structure 110, wherein the conductive via CV1 is electrically coupled to the conductive via CV3, and the first region R1 is interposed between the second active surface 160a of the second die 160 and the first active surface 120a of one of the first die 120. The conductive via CV3 connected to one of the contact feature 166 of the second die 160 through the first conductive pad CP4 is staggered from the conductive via CV1 connected to one of the contact feature 126 of the first die 120 through the conductive pad CP1.

Figure 2:
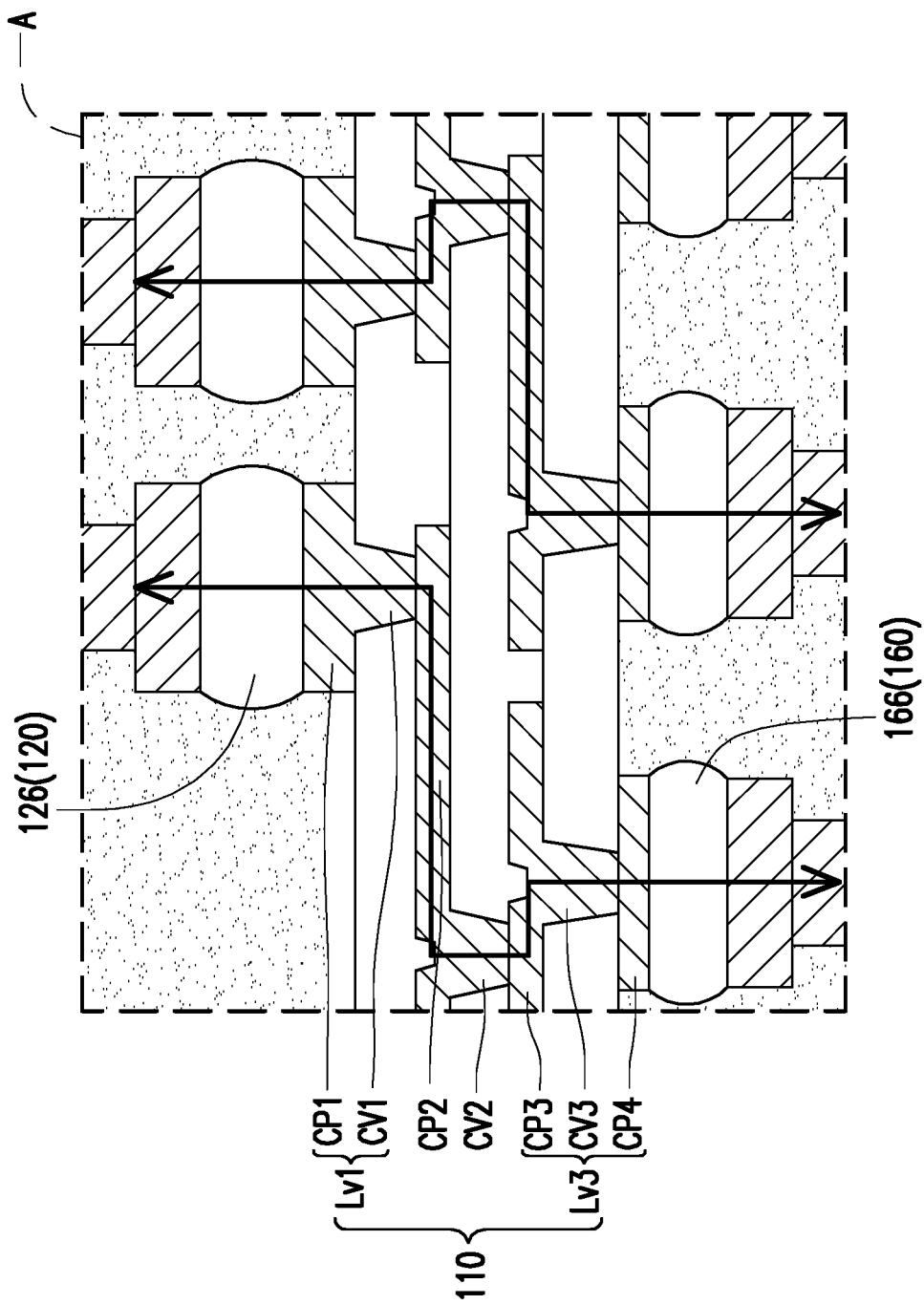
FIG. 2 is a schematic and enlarged view illustrating a dashed box A outlined in FIG. 1F according to an embodiment of the disclosure.

FIG. 2 is a schematic and enlarged view illustrating a dashed box A outlined in FIG. 1F according to an embodiment of the disclosure. Referring to FIG. 1F and FIG. 2, the conductive pad CP1, and the conductive via CV1 physically and electrically connected to the conductive pad CP1 are formed at the topmost level Lv1 of the redistribution structure 110 proximal to the first dies 120. The first conductive pads CP4, and the conductive via CV3 physically and electrically connected to the first conductive pad CP4 are formed at the bottom level Lv3 of the redistribution structure 110 proximal to the second die 160. The conductive via CV3 and the second die 160 are connected to two opposite sides of the first conductive pads CP4. The conductive via CV1 is laterally offset or shifted from the conductive via CV3. The electrical signals (as indicated by arrows) of the first dies 120 may be transmitted from or to the second die 160 through the conductive pad CP1 connected to the contact feature 126 of the first die 120, the conductive via CV1, the conductive via CV3, the first conductive pad CP4 connected to the contact feature 166 of the second die 160, and the conductive features (conductive pads CP2 and CP3, conductive via CV2) at intermediate level(s) physically and electrically connected among them.

The shifted-via configuration (e.g., conductive vias CV1, CV2, CV3 are offset from one another) may absorb or buffer the stress when the redistribution structure 110 is subjected to mechanical and/or thermal stress. In contrast, if the conductive vias (e.g., conductive vias CV1, CV2, CV3) are vertically aligned and stacked among the first dies and the second die, such portion of the redistribution structure may be subjected to massive stress concentration during operation, and has a higher likelihood of crack formation. Since the shifted vias (e.g., conductive vias CV1, CV2, CV3) of the redistribution structure 110 are formed among the contact features 126 and 166 of the first dies 120 and the second die 160, such shifted-via configuration of routing may offer good reliability for the semiconductor package SP1 and generate less stress during processing and operation, thereby eliminating cracks and other defects issue. It should be noted that the configuration shown in FIG. 2 is exemplary, and other configurations are possible.

Figure 3A:
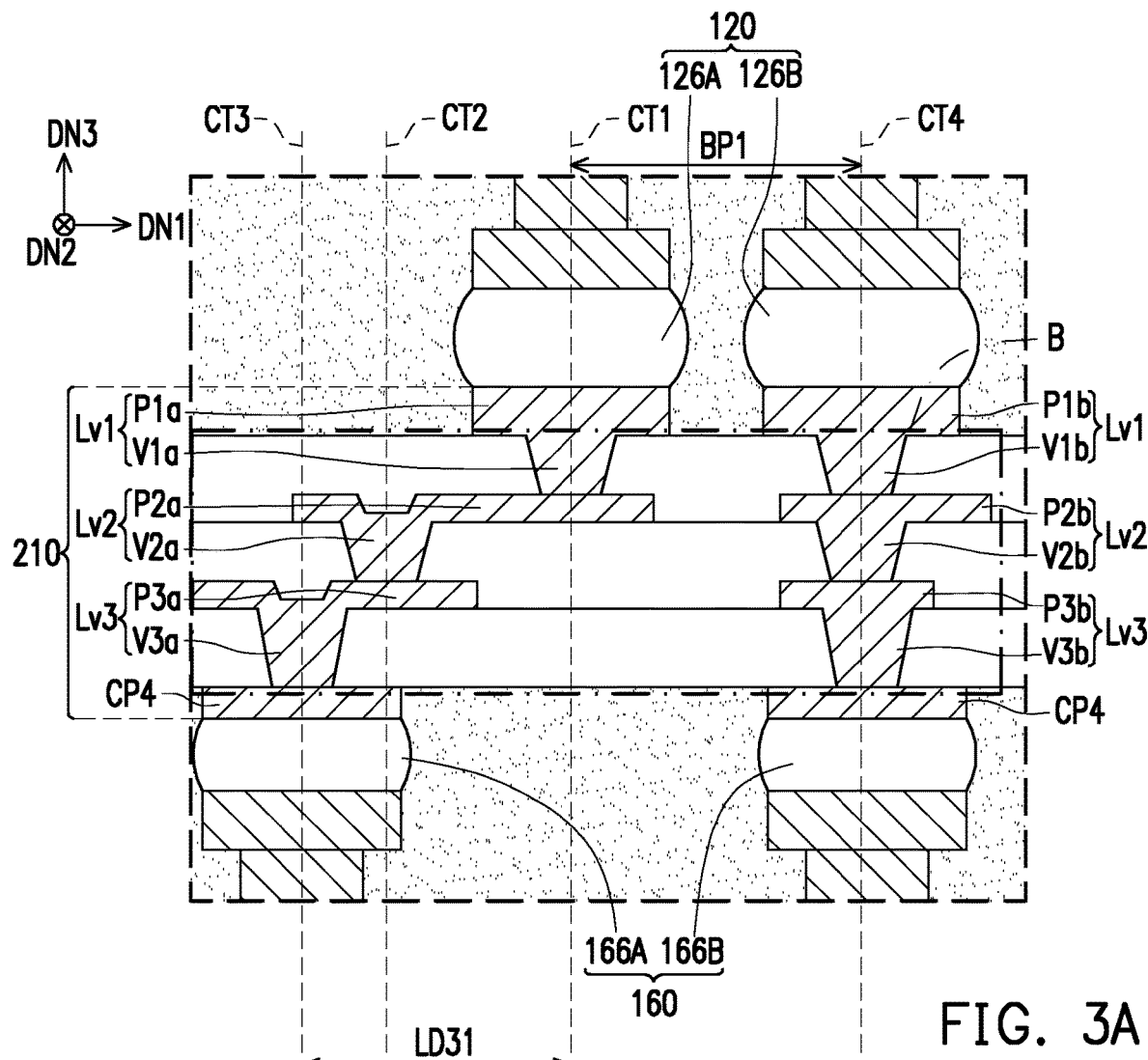
FIG. 3A is a schematic cross-sectional view illustrating a portion of a redistribution structure connected to a first die and a second die according to an embodiment of the disclosure.
Figure 3B:
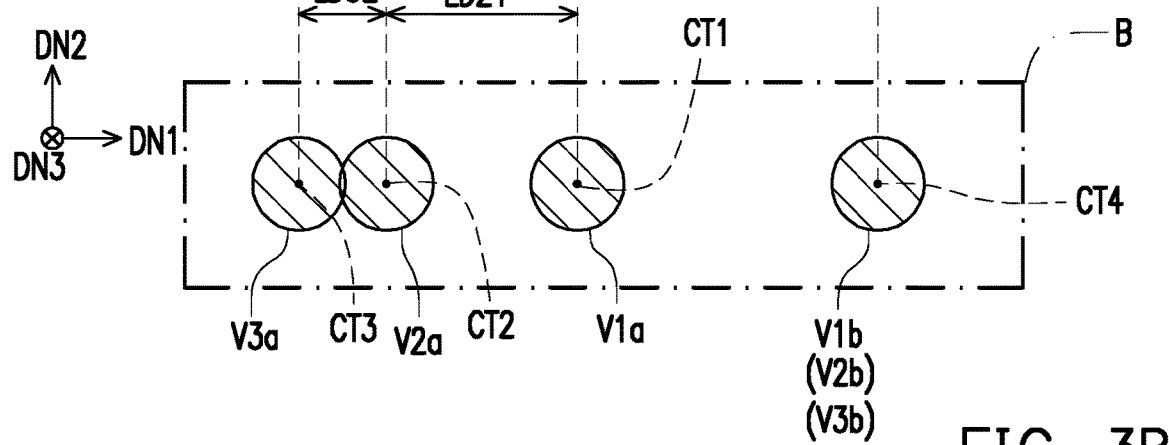
FIG. 3B is a schematic top view illustrating conductive vias in different levels of a redistribution structure outlined in a dashed box B of FIG. 3A according to an embodiment of the disclosure.

FIG. 3A is a schematic cross-sectional view illustrating a portion of a redistribution structure connected to a first die and a second die according to an embodiment of the disclosure, and FIG. 3B is a schematic top view illustrating conductive vias in different levels of a redistribution structure outlined in a dashed box B of FIG. 3A according to an embodiment of the disclosure. For example, FIG. 3A, which is similar to FIG. 2, is a partial view showing the bonding region between the first die 120 and the second die 160. The difference between the embodiments shown in FIG. 2 and FIG. 3A lies in the configuration of the redistribution structure. The conductive vias shown in the top down view of FIG. 3B may be considered as the orthographic projection areas of the conductive vias on the active surface of the second die. It should be noted that for ease of explanation and simplification of illustration, some of the elements (e.g., dielectric layer, conductive pads, conductive lines, etc.) are omitted in FIG. 3B.

Referring to FIG. 3A and FIG. 3B, the contact feature 126A of the first die 120 is electrically connected to the contact feature 166A of the second die 160 through a first circuitry of redistribution structure 210 including the conductive pads (P1a, P2a, and P3a) and the conductive vias (V1a, V2a, and V3a) at different levels (Lv1, Lv2, and Lv3) for transmitting a first electrical signal between the first die 120 and the second die 160. For example, the contact feature 126A is bonded to the conductive pad P1a, the conductive via V1a extending from the conductive pad P1a lands on the conductive pad P2a, the conductive via V2a extends from the conductive pad P2a and lands on the conductive pad P3a, the conductive via V3a extends from the conductive pad P3a and is connected to the first conductive pad CP4, and the first conductive pad CP4 is connected to the contact feature 166A.

The first circuitry of redistribution structure 210 illustrates an example where the offset direction for the conductive vias (V1a, V2a, and V3a) at each level (Lv1, Lv2, and Lv3) is in the same direction. For example, the center CT3 of the conductive via V3a at the bottommost level Lv3 and the center CT2 of the conductive via V2a at the intermediate level Lv2 are staggered by an offset LD32 in the first direction DN1, and the center CT3 of the conductive via V3a and the center CT1 of the conductive via V1a at the topmost level Lv1 are staggered by an offset LD31 in the first direction DN1. The center CT2 of the conductive via V2a at the intermediate level Lv2 and the center CT1 of the conductive via V1a at the topmost level Lv1 are staggered by an offset LD21 in the first direction DN1. For example, the offset (e.g., LD31, LD32, LD21) is about 0.5 times to about 3 times the pitch BP1 between the contact features 126A and 126B.

The first direction DN1 (e.g., x-direction), the second direction DN2 (e.g., y-direction), and the third direction DN3 (e.g., z-direction) may be perpendicular to one another. In other embodiments, the center CT1 of the conductive via V1a is shifted from the center CT3 of the conductive via V3a in the opposite direction with respective to the direction from the center CT3 to the center CT2 of the conductive via V2a. In some embodiments, the centers (CT1, CT2, CT3) of the conductive vias (V1a, V2a, V3a) are staggered in the first direction DN1, but may be substantially aligned in the second direction DN2. Alternatively, the centers of the conductive vias are staggered in both of the first direction DN1 and the second direction DN2 as will be described later in other embodiments. For example, the conductive vias (e.g., V2a and V3a) at different levels (e.g., Lv2 and Lv3) are misaligned, but partially overlapping, from a top perspective, with each other. The conductive vias (e.g., V2a and V1a) at different levels (e.g., Lv2 and Lv1) are completely non-aligned with and non-overlapping, from a top perspective, with each other.

Continue to FIG. 3A and FIG. 3B, the contact feature 126B of the first die 120 is electrically connected to the contact feature 166B of the second die 160 through a second circuitry of redistribution structure 210 including the conductive pads (P1b, P2b, and P3b) and the conductive vias (V1b, V2b, and V3b) at different levels (Lv1, Lv2, and Lv3) for transmitting a second electrical signal between the first die 120 and the second die 160. The first electrical signal and the second electrical signal may be the same or different. For example, the contact feature 126B is bonded to the conductive pad P1b, the conductive via V1b extending from the conductive pad P1b lands on the conductive pad P2b, the conductive via V2b extends from the conductive pad P2b and lands on the conductive pad P3b, the conductive via V3b extends from the conductive pad P3b and is connected to the first conductive pad CP4, and the first conductive pad CP4 is connected to the contact feature 166B.

The second circuitry of redistribution structure 210 illustrates an example of the configuration of stacked conductive vias (V1b, V2b, and V3b). For example, in the top view as shown in FIG. 3B, the centers CT4 of the conductive vias (V1b, V2b, and V3b) at different levels (Lv1, Lv2, and Lv3) are substantially aligned in both of the first direction DN1 and the second direction DN2. For the sake of reference, this arrangement of conductive vias (V1b, V2b, and V3b) is referred to as a stacked-via configuration. The stacked-via configuration may occupy less space with in the redistribution structure 210, such that the shifted-via configuration may be in accompanying with the stacked-via configuration in the redistribution structure to buffer the stress and also save the routing space.

Figure 4A:
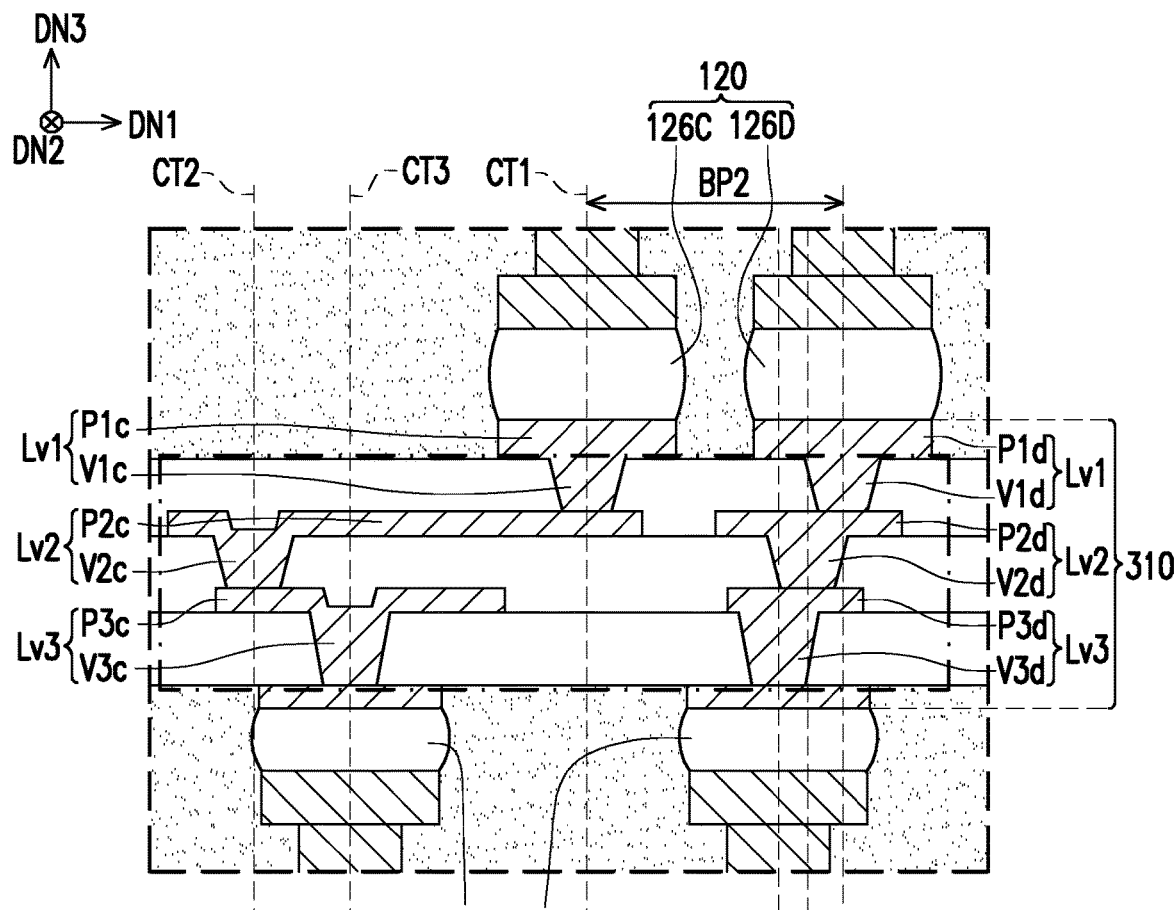
FIG. 4A is a schematic cross-sectional view illustrating a portion of a redistribution structure connected to a first die and a second die according to an embodiment of the disclosure.
Figure 4B:
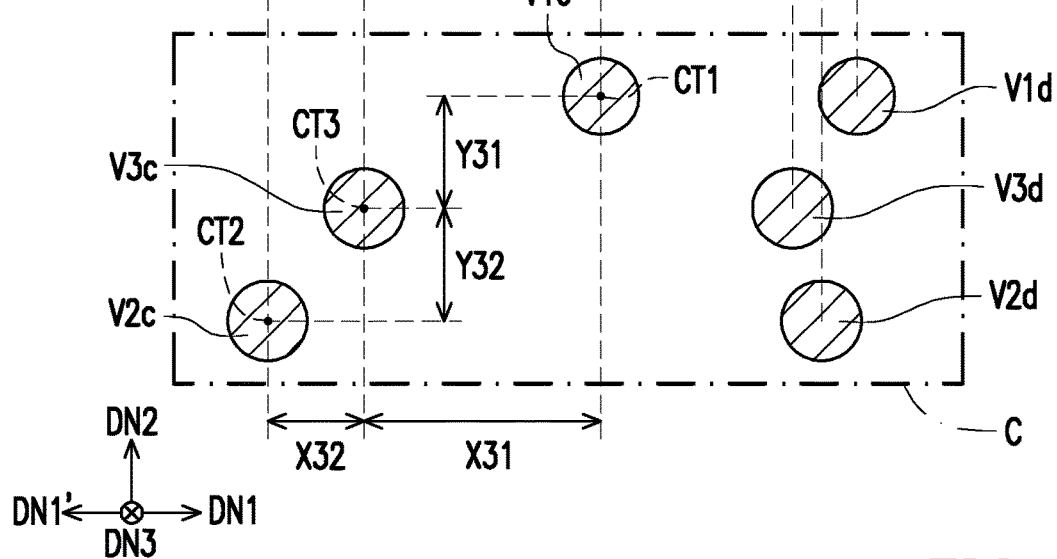
FIG. 4B is a schematic top view illustrating conductive vias in different levels of a redistribution structure outlined in a dashed box C of FIG. 4A according to an embodiment of the disclosure.

FIG. 4A is a schematic cross-sectional view illustrating a portion of a redistribution structure connected to a first die and a second die according to an embodiment of the disclosure, and FIG. 4B is a schematic top view illustrating conductive vias in different levels of a redistribution structure outlined in a dashed box C of FIG. 4A according to an embodiment of the disclosure. For example, FIG. 4A, which is similar to FIG. 2, is a partial view showing the bonding region between the first die 120 and the second die 160. The difference between the embodiments shown in FIG. 2 and FIG. 4A lies in the configuration of the redistribution structure. The conductive vias shown in the top down view of FIG. 4B may be considered as the orthographic projection areas of the conductive vias on the active surface of the second die. It should be noted that for ease of explanation and simplification of illustration, some of the elements (e.g., dielectric layer, conductive pads, conductive lines, etc.) are omitted in FIG. 4B.

Referring to FIG. 4A and FIG. 4B, the contact feature 126C of the first die 120 is electrically connected to the contact feature 166C of the second die 160 through a first circuitry of redistribution structure 310 including the conductive pads (P1c, P2c, and P3c) and the conductive vias (V1c, V2c, and V3c) at different levels (Lv1, Lv2, and Lv3) for transmitting a first electrical signal between the first die 120 and the second die 160. The configuration of the first circuitry of redistribution structure 310 shown in FIG. 4A is similar to that of the first circuitry of redistribution structure 210 shown in FIG. 3A, except that the conductive vias (V1c, V2c, and V3c) of the first circuitry of the redistribution structure 310 are shifted in both of the first direction DN1 and the second direction DN2.

In some embodiments, the conductive vias (V1c, V2c, and V3c) at different levels (Lv1, Lv2, and Lv3) are completely non-aligned with and non-overlapping, from a top perspective, with one another. For example, the center CT2 of the conductive via V2c at the intermediate level Lv2 is shifted from the center CT3 of the conductive via V3c at the bottommost level Lv3 by a vertical offset Y32 in the second direction DN2 and a horizontal offset X32 in the direction DN1' opposite to the first direction DN1. The center CT1 of the conductive via V1a at the topmost level Lv1 may be shifted from the center CT3 of the conductive via V3a by a horizontal offset X31 in the first direction DN1 and a vertical offset Y31 in the direction DN2. For example, the horizontal offset (e.g., X31, X32, or the combinations of X31 and X32) or the vertical offset (e.g., Y31, Y32, or the combinations of Y31 and Y32) is about 0.5 times to about 3 times the pitch BP2 between the contact features 126C and 126D.

Continue to FIG. 4A and FIG. 4B, the contact feature 126D of the first die 120 is electrically connected to the contact feature 166D of the second die 160 through a second circuitry of redistribution structure 310 including the conductive pads (P1d, P2d, and P3d) and the conductive vias (V1d, V2d, and V3d) at different levels (Lv1, Lv2, and Lv3) for transmitting a second electrical signal between the first die 120 and the second die 160. The configuration of the second circuitry of redistribution structure 310 shown in FIG. 4A is similar to that of the second circuitry of redistribution structure 210 shown in FIG. 3A, except that the conductive vias (V1d, V2d, and V3d) of the second circuitry of the redistribution structure 310 are partially stacked in the cross-sectional view. For example, the conductive vias (V1d, V2d, and V3d), which are similar to the conductive vias (V1c, V2c, and V3c), are shifted in two dimensions (e.g., in both of first and second directions) as shown in FIG. 4B. Alternatively, the conductive vias (V1d, V2d, and V3d) at different levels (Lv1, Lv2, and Lv3) may be misaligned, but partially overlapping, from a top perspective, with one another. The arrangement of the conductive vias (V1d, V2d, and V3d) with slightly offsets may facilitate occupying less space and reducing stress.

Figure 5B:
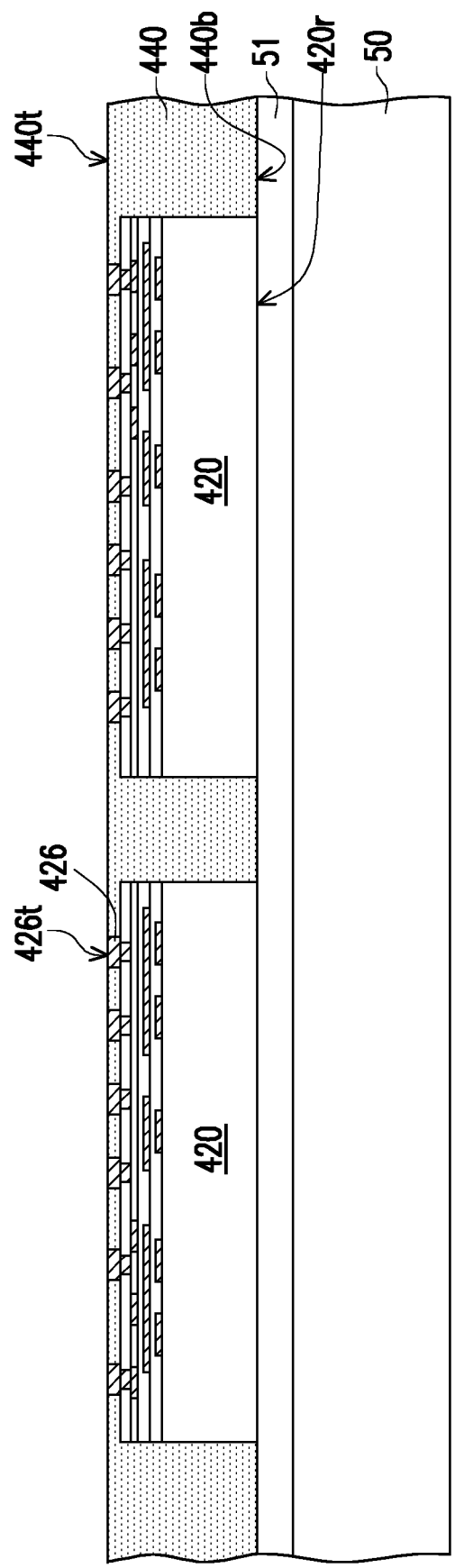

FIG. 5A to FIG. 5E are schematic cross-sectional views illustrating a manufacturing method of a semiconductor package according to an embodiment of the disclosure. Referring to FIG. 5A, a plurality of first dies 420 is disposed separately on the temporary carrier 50. The first dies 420 may be similar to the first dies 120 as described in FIG. 1B, except that the contact features 426 distributed at the active surfaces 420a of the first dies 420 are free of solder material. In some embodiments, the rear surfaces 420r of the first dies 420 are bonded to the temporary carrier 50 through the de-bonding layer 51. Alternatively, the de-bonding layer 51 is omitted.

Referring to FIG. 5B, an insulating encapsulation 440 is formed over the temporary carrier 50 to laterally encapsulate the first dies 420. In some embodiments, the first dies 420 are over-molded by the insulating material, and then the insulating material is thinned by, for example, grinding, chemical-mechanical polishing (CMP), etching, and/or the like, until the contact features 426 of the first dies 420 are exposed for further electrical connection. The contact feature 426 may be or may include a conductive bump, a conductive pad, a conductive ball, etc. The top surface 440t of the insulating encapsulation 440 may be substantially coplanar with the top surfaces 426t of the contact features 426 of the first dies 420. The bottom surface 440b of the insulating encapsulation 440 may be substantially coplanar with the rear surfaces 420r of the first dies 420.

Figure 5C:
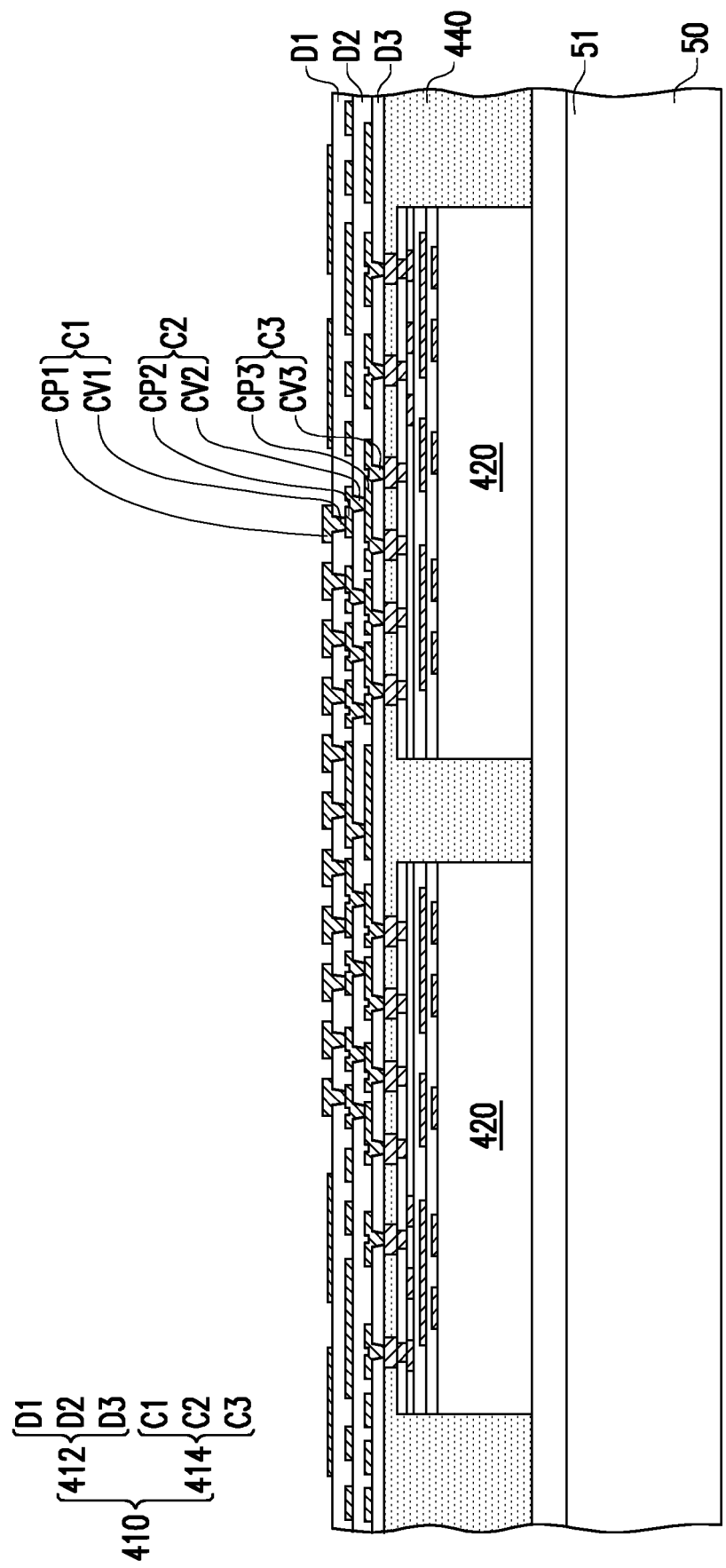

Referring to FIG. 5C, the redistribution structure 410 is formed on the top surface 440t of the insulating encapsulation 440 and the top surfaces 426t of the contact features 426 of the first dies 420. In some embodiments, the redistribution structure 410 includes a plurality of patterned dielectric layers 412 (e.g., the topmost dielectric layer D1, the intermediate dielectric layer D2, the bottommost dielectric layer D3) and a plurality of patterned conductive layers 414 (e.g., the topmost conductive layer C1, the intermediate conductive layer C2, the bottommost conductive layer C3) alternately stacked upon one another. Each level of the patterned conductive layers 414 may include conductive lines, conductive pads, conductive vias, etc. The conductive lines and the conductive pads at one level of the patterned conductive layers 414 may be formed on the top surface of the underlying patterned dielectric layer 412. The conductive vias connected to the conductive pads and may penetrate through the patterned dielectric layer 412 such that the conductive vias are laterally covered by the patterned dielectric layer 112. In some embodiments, the patterned dielectric layer 412 is formed prior to the patterned conductive layer 414. In other embodiments, the patterned conductive layer 414 is formed prior to the patterned dielectric layer 412. The materials and forming process of the redistribution structure 410 may be similar to those of the redistribution structure 110 described in FIG. 1A.

In an exemplary embodiment, the formation of the redistribution structure 410 includes at least the following steps. The dielectric material is formed on the insulating encapsulation 440 and the first dies 420, and then a portion of the dielectric material is removed to form the bottommost dielectric layer D3 with openings revealing at least a portion of the top surfaces 426t of the contact features 426. Next, the conductive materials are formed and patterned to form the bottommost conductive layer C3 including the conductive pads CP3 and the conductive vias CV3. The conductive vias CV3 may be formed in the openings of the bottommost dielectric layer D3 to be physically and electrically connected to the contact features 426 of the first dies 420. The conductive pads CP3 may be physically and electrically connected to the conductive vias CV3 opposite to the contact features 426. Next, the intermediate dielectric layer D2 with openings may be formed on the bottommost dielectric layer D3, and the openings of the intermediate dielectric layer D2 may expose at least a portion of the conductive pads CP3. Subsequently, the intermediate conductive layer C2 including the conductive pads CP2 and the conductive vias CV2 is formed on the intermediate dielectric layer D2 and inside the openings of the intermediate dielectric layer D2. Similarly, the topmost dielectric layer D1 and the topmost conductive layer C1 are formed on the intermediate dielectric layer D2 and the intermediate conductive layer C2.

In some embodiments, the conductive vias (e.g., CV1, CV2, CV3) of each of the patterned conductive layers 414 are tapered towards the first dies 420. Alternatively, the conductive vias may have substantially vertical sidewalls. The conductive vias (e.g., CV1, CV2, CV3) of one of the patterned conductive layers 414 may be laterally shifted from the corresponding conductive vias of the adjacent one of the patterned conductive layers 414. It should be noted that a three-layered redistribution structure shown in FIG. 5A is for illustrative purpose, and the number of levels of the redistribution structure 410 construes no limitation in the disclosure. The configuration of the redistribution structure 410 is similar to that of the redistribution structure 110 or the variations described herein in the disclosure. It should be appreciated that combination schemes modifications, or variations of the configurations discussed in FIG. 1A, FIG. 3A, and FIG. 4A are possible to form the redistribution structure 410, and the detailed descriptions are omitted for brevity.

Figure 5D:
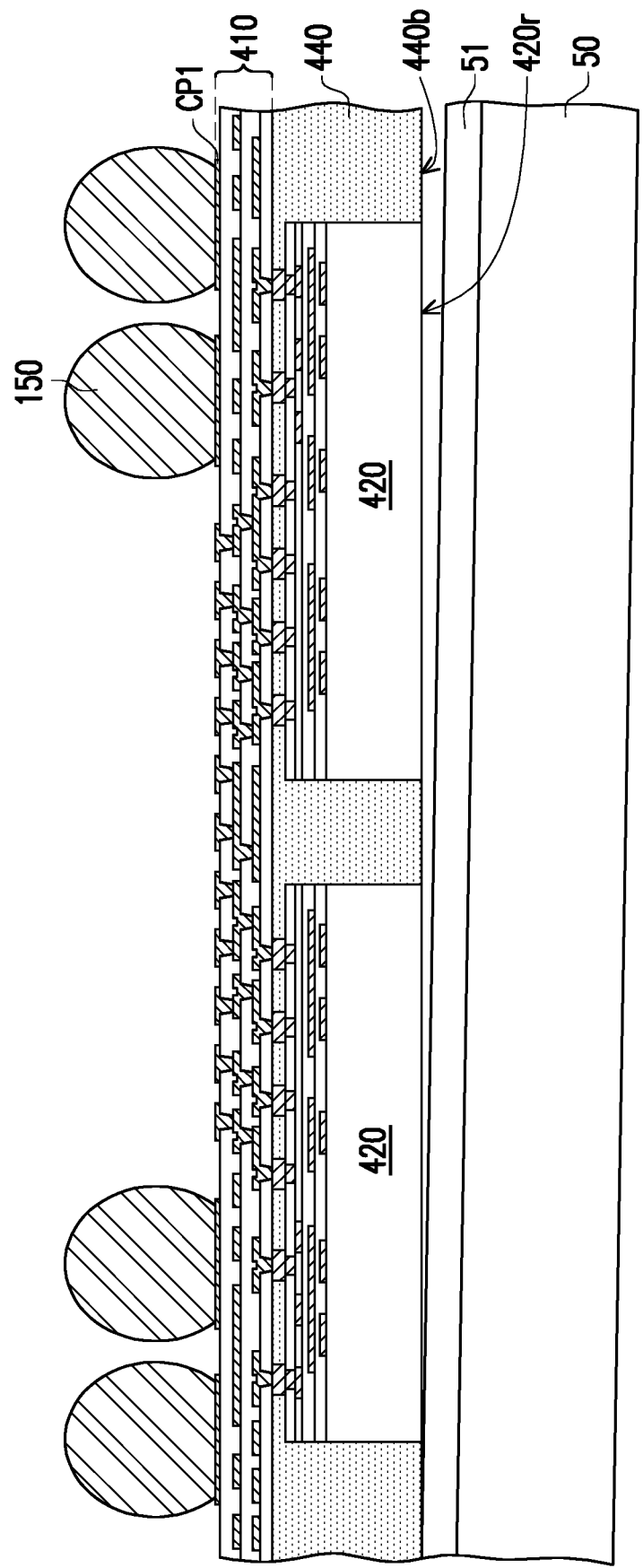

Referring to FIG. 5D, the conductive terminals 150 are formed on the conductive pads CP1 of the topmost conductive layer C1. The materials and the forming process of the conductive terminals 150 may be similar to those of the conductive terminals 150 described in FIG. 1E. After forming the conductive terminals, the temporary carrier 50 is optionally de-bonded to expose the bottom surface 440b of the insulating encapsulation 440 (and the rear surface 420r of the first dies 420, in some embodiments).

Figure 5E:
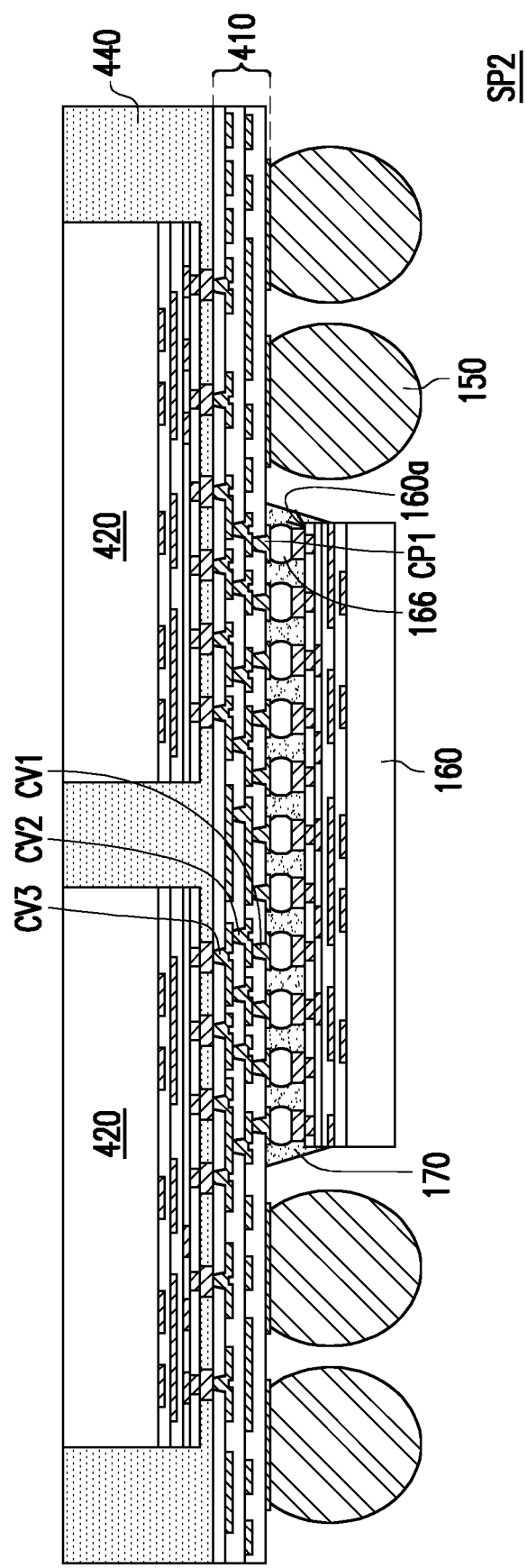

Referring to FIG. 5E, the second die 160 is mounted on the redistribution structure 410 to be electrically coupled to the first dies 420. For example, the flip-chip bonding is performed to bond the contact features 166 to the conductive pads CP1 of the redistribution structure 410. The underfill 170 may be formed between the active surface 160a of the second die 160 and the redistribution structure 410 to enhance the bonding between the second die 160 and the redistribution structure 410. Subsequently, the singulation process may be performed to form a plurality of semiconductor packages SP2. Up to here, the manufacturing process of the semiconductor package SP2 is substantially completed.

The semiconductor package SP2 and the semiconductor package SP1 shown in FIG. 1F are fabricated by different process sequences. The structural difference between the semiconductor package SP1 and SP2 includes that the contact features 426 of the first dies 420 of the semiconductor package SP2 are free of solder materials and the conductive vias CV3 of the redistribution structure 410 of the semiconductor package SP2 are directly connected to the contact features 426, so that the interface between the first dies 420 and the redistribution structure 410 is free of solder materials. Since the redistribution structure 410 of the semiconductor package SP2 is formed on the first dies 420 after encapsulating the first dies 420, the conductive vias (e.g., CV1, CV2, CV3) are tapered from the second die 160 towards the first die 420. On the other hand, the redistribution structure 110 of the semiconductor package SP1 is formed prior to mounting the first dies 120, and the conductive vias (e.g., CV1, CV2, CV3) are tapered from the first die 120 towards the second die 160.

The semiconductor package described in the disclosure may be mounted to an external device including package substrate, a printed circuit board, a system board, a mother board, etc. For example, the electrical signals of the first dies and the second die of the semiconductor package are transmitted to the external device through the conductive terminals of the semiconductor package. Other application of the semiconductor package may be possible.

Based on the above, since the semiconductor package includes the first dies and the second die disposed in a face-to-face configuration for shortening interconnection distance therebetween, the lower power consumption and high bandwidth of the semiconductor package may be achieved. The first and second conductive vias of the redistribution structure are disposed in a shifted-via configuration, such that the semiconductor package having such shifted-via configuration may offer good reliability and generate less stress during processing and operation, thereby eliminating cracks and other defects issue.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A semiconductor package, comprising:
   a plurality of first dies disposed side by side;
   an insulating encapsulation laterally encapsulating the first dies, and a portion of the insulating encapsulation separating the first dies from one another;
   a second die disposed over the portion of the insulating encapsulation and at least partially overlapping the first dies, a second active surface of the second die facing toward first active surfaces of the first dies, wherein each of the plurality of first dies comprises a plurality of contact features distributed at the first active surface with a first pitch and a second pitch, the second pitch away from the second die than the first pitch, and the first pitch is less than the second pitch; and
   a redistribution structure disposed on the insulating encapsulation and electrically connected to the first dies and the second die, the redistribution structure comprising:
      a first conductive via disposed at a first level of the redistribution structure proximal to the first dies;
      a second conductive via disposed at a second level of the redistribution structure proximal to the second die, the second level being stacked on the first level, the first conductive via and the second conductive via being electrically coupled and disposed in a region of the redistribution structure interposed between the second active surface of the second die and the first active surface of one of the first dies, wherein the first conductive via is staggered from the second conductive via by a lateral offset;
      a third conductive via disposed aside the first conductive via at the first level;
   and
      a fourth conductive via disposed aside the second conductive via at the second level, and a center of the third conductive via being substantially aligned with a center of the fourth conductive via, wherein the first die and the second die connect by the third conductive via and the fourth conductive via,
   wherein the redistribution structure further comprises:
      a first conductive pad disposed on a first surface of the redistribution structure, the first conductive via extending from the first conductive pad, the one of the first die being mounted on the first conductive pad; and
      a second conductive pad connected to the second conductive via and disposed on a second surface of the redistribution structure opposite to the first surface, the second die being mounted on the second conductive pad.

2. The semiconductor package of claim 1, further comprising:
   a plurality of conductive terminals disposed on the second level of the redistribution structure and surrounding the second die, and the conductive terminals electrically coupled to the first dies and the second die.

3. The semiconductor package of claim 2, wherein a signal of the second die is transmitted from or to the conductive terminals through a circuitry of the redistribution structure disposed corresponding to the portion of the insulating encapsulation.

4. The semiconductor package of claim 1, further comprising:
   an underfill disposed between the second level of the redistribution structure and the second active surface of the second die.

5. The semiconductor package of claim 1, wherein a first orthographic projection area of the first conductive via on the second active surface of the second die is completely non-overlapping with a second orthographic projection area of the second conductive via on the second active surface of the second die.

6. The semiconductor package of claim 1, wherein a first orthographic projection area of the first conductive via on the second active surface of the second die is at least partially overlapping with a second orthographic projection area of the second conductive via on the second active surface of the second die.

7. The semiconductor package of claim 1, wherein the one of the first die is mounted on the first conductive pad through a first solder cap of a first contact feature of the one of the first die, and the second die is mounted on the second conductive pad through a second solder cap of a second contact feature of the second die.

8. The semiconductor package of claim 1, wherein the first conductive via at the first level of the redistribution structure is directly connected to a contact feature of the one of the first dies at the first active surface.

9. The semiconductor package of claim 8, wherein an interface between the redistribution structure and the first dies is substantially leveled with an interface between the redistribution structure and the insulating encapsulation.

10. A manufacturing method of a semiconductor package, comprising:
    disposing a plurality of first dies on a first surface of a redistribution circuitry, wherein the redistribution circuitry comprises a first conductive via formed at a first level of the redistribution circuitry proximal to the first dies, a second conductive via formed at a second level of the redistribution circuitry stacked on the first level, and a center of the first conductive via is laterally offset from a center of the second conductive via, a third conductive via disposed aside the first conductive via at the first level, and a fourth conductive via disposed aside the second conductive via at the second level, and a center of the third conductive via being substantially aligned with a center of the fourth conductive via;

forming an insulating encapsulation on the redistribution circuitry to encapsulate the first dies, wherein a portion of the insulating encapsulation is formed between the adjacent first dies; and disposing a second die on a second surface of the redistribution circuitry opposite to the first surface, wherein the second die covers the portion of the insulating encapsulation and is electrically coupled to the first dies through the redistribution circuitry, wherein each of the plurality of first dies comprises a plurality of contact features distributed at the first active surface with a first pitch and a second pitch, the second pitch away from the second die than the first pitch, and the first pitch is less than the second pitch, wherein the first die and the second die connect by the third conductive via and the fourth conductive via.

11. The manufacturing method of claim 10, further comprising:

forming a plurality of conductive pads on the second conductive via at the second surface of the redistribution circuitry before disposing the second die, wherein after disposing the second die, the plurality of contact features of the second die are bonded to the conductive pads.

12. The manufacturing method of claim 10, further comprising:

forming an underfill between the second surface of the redistribution circuitry and the second die after disposing the second die.

13. The manufacturing method of claim 10, further comprising:

forming a plurality of conductive terminals on the conductive pads before disposing the second die, wherein after disposing the second die, the second die is surrounded by the conductive terminals and electrically coupled to the conductive terminals through the redistribution circuitry.

14. The manufacturing method of claim 10, further comprising:

performing a soldering process on first interfaces between the first dies and the first surface of the redistribution circuitry when disposing the first dies; and performing the soldering process on a second interface between the second die and the second surface of the redistribution circuitry when disposing the second die.

15. A manufacturing method of a semiconductor package, comprising:

encapsulating a plurality of first dies with an insulating encapsulation, wherein a portion of the insulating encapsulation is formed between two of the adjacent first dies;

forming a redistribution circuitry on the first dies and the insulating encapsulation, wherein the redistribution circuitry comprises a first conductive via formed at a first level of the redistribution circuitry and connected to a contact feature of one of the first dies exposed by the insulating encapsulation, a second conductive via disposed at a second level of the redistribution circuitry stacked on the first level, and a center of the first conductive via is staggered from a center of the second conductive via by an offset, a third conductive via disposed aside the first conductive via at the first level, and a fourth conductive via disposed aside the second conductive via at the second level, and a center of the third conductive via being substantially aligned with a center of the fourth conductive via; and disposing a second die on the second level of the redistribution circuitry to be electrically coupled to the first dies through the redistribution circuitry, wherein each of the plurality of first dies comprises a plurality of contact features distributed at the first active surface with a first pitch and a second pitch, the second pitch away from the second die than the first pitch, and the first pitch is less than the second pitch, wherein the first die and the second die connect by the third conductive via and the fourth conductive via.

16. The manufacturing method of claim 15, wherein encapsulating the first dies with the insulating encapsulation comprises:

forming an insulating material to cover the first dies; and thinning the insulating material to expose at least a portion of the contact feature of the one of the first dies.

17. The manufacturing method of claim 15, further comprising:

forming a plurality of conductive terminals on the second level of the redistribution circuitry before disposing the second die, wherein after disposing the second die, the second die is surrounded by the conductive terminals and electrically coupled to the conductive terminals through the redistribution circuitry.

18. The manufacturing method of claim 15, further comprising forming an underfill between the second level of the redistribution circuitry and the second die after disposing the second die.

* * * * *